United States Patent
Lu et al.

(10) Patent No.: US 9,442,365 B2
(45) Date of Patent: Sep. 13, 2016

(54) MASK FOR EXTREME ULTRAVIOLET LITHOGRAPHY AND METHOD OF FABRICATING SAME

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 222 days.

(21) Appl. No.: 14/209,780

(22) Filed: Mar. 13, 2014

(65) Prior Publication Data
US 2014/0272686 A1     Sep. 18, 2014

Related U.S. Application Data

(60) Provisional application No. 61/786,973, filed on Mar. 15, 2013.

(51) Int. Cl.
    *G03F 1/24*     (2012.01)
    *G03F 1/22*     (2012.01)
    *G03F 1/38*     (2012.01)

(52) U.S. Cl.
    CPC .. *G03F 1/38* (2013.01); *G03F 1/22* (2013.01)

(58) Field of Classification Search
    CPC .................................... G03F 1/24; G03F 1/22
    See application file for complete search history.

(56) References Cited

U.S. PATENT DOCUMENTS 7,932,002 B2     4/2011    Takai
2014/0051015 A1*   2/2014    Gallagher ................. G03F 1/24
                                                                                       430/5

* cited by examiner

*Primary Examiner* — Stephen Rosasco
(74) *Attorney, Agent, or Firm* — Haynes and Boone, LLP (57) ABSTRACT

A mask and method of fabricating same are disclosed. In an example, a mask includes a substrate, a reflective multilayer coating disposed over the substrate and a patterned absorption layer disposed over the reflective multilayer. The patterned absorption layer has a mask image region and a mask border region. The exemplary mask also includes a mask border frame disposed over the mask border region. The mask border frame has a top surface and a bottom surface. The top surface is not parallel to the bottom surface.

20 Claims, 6 Drawing Sheets

MASK FOR EXTREME ULTRAVIOLET LITHOGRAPHY AND METHOD OF FABRICATING SAME

This patent claims the benefit of U.S. Ser. No. 61/786,973 filed on Mar. 15, 2013, which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, higher resolution lithography processes, such as extreme ultraviolet (EUV) lithography processes, are implemented to meet size constraints approaching critical dimension tolerances of 32 nm technology nodes and below. EUV lithography uses a reflective mask (also referred to as a reticle) to transfer a pattern of a layer of an integrated circuit device to a wafer. An exemplary reflective mask is a phase shift mask, which typically includes a patterned absorption layer disposed on a reflective multilayer coating (multi-layered mirror stack), where the patterned absorption layer defines the pattern of the layer of the integrated circuit device in a mask image region of the phase shift mask. Conventional EUV lithography tools undesirably project EUV radiation onto a portion of the phase shift mask outside the mask image region of the phase shift mask, resulting in undesired exposure or overexposure of portions of the exposed wafer. Such undesired exposure (or overexposure) leads to reduced aerial image contrast in the patterns printed on the exposed wafer. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
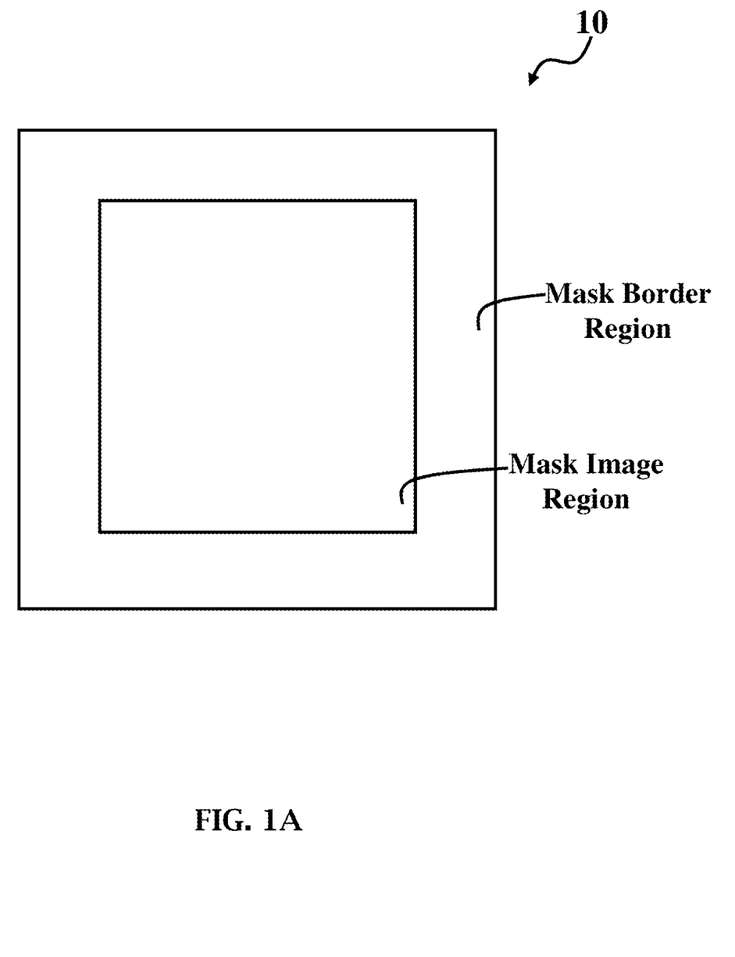
FIG. 1A is a top schematic view of a mask, in portion or entirety, according to various aspects of the present disclosure.
Figure 1B:
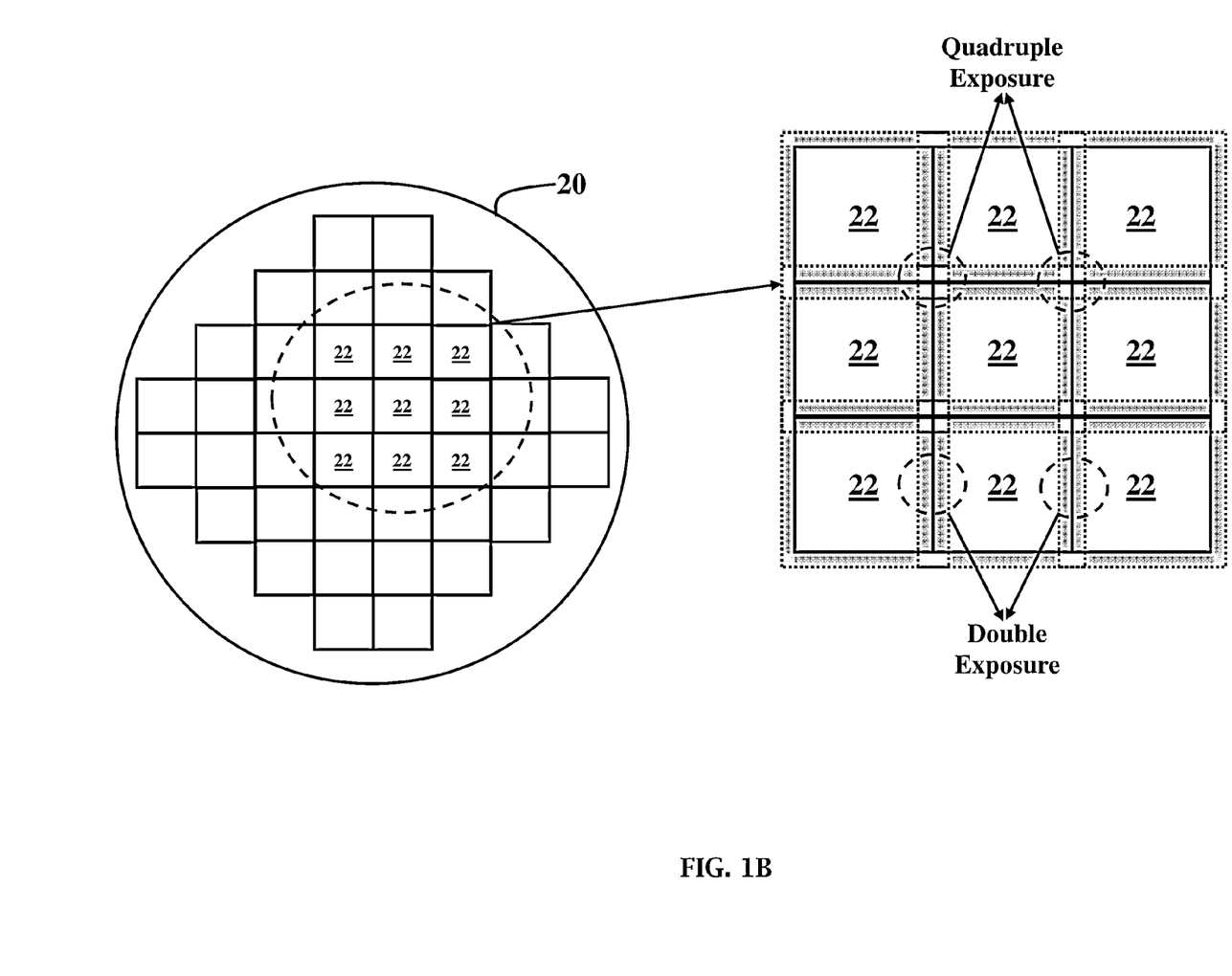
FIG. 1B is a top schematic view of a wafer that is exposed using the mask of FIG. 1A according to various aspects of the present disclosure.

FIG. 1A is a top schematic view of a mask 10, in portion or entirety, according to various aspects of the present disclosure, and FIG. 1B is a top schematic view of a wafer 20, in portion or entirety, that is exposed using the mask 10 of FIG. 1A according to various aspects of the present disclosure. FIGS. 1A and 1B will be discussed concurrently, and FIGS. 1A and 1B have been simplified for the sake of clarity to better understand the inventive concepts of the present disclosure.

The mask 10 is a reflective mask. In one embodiment, the mask 10 is a phase shift mask, such as an attenuated phase shift mask (AttPSM). Alternatively, the phase shift mask is an alternating phase shift mask (AltPSM). The mask 10 includes a mask image region and a mask border (or frame) region. The mask image region is an area of the mask 10 that includes a pattern (or design) of a layer of an integrated circuit device. The mask border region is an area of the mask 10 that does not include the pattern of the layer of the integrated circuit device. The mask border, in the present example, surrounds the mask image region and defines the mask image region of the mask 10.

The mask 10 is used to transfer the pattern of the mask image region to a wafer, such as the wafer 20. In the present example, where the mask 10 is a phase shift mask, the mask 10 includes absorptive regions, which absorb light incident thereon, and reflective regions, which reflect light incident thereon. The absorptive regions can be configured to reflect light incident thereon with a phase different than light reflected by the reflective regions, such that resolution and image quality of the pattern transferred to the wafer 20 can be enhanced. The reflective and absorptive regions of the mask 10 are patterned such that light reflected from the reflective regions (and, in some cases, the absorptive regions) projects onto the wafer 20 and transfers the pattern of the mask image region to the wafer 20. For example, during an exposure process, light (radiation) is projected onto the mask 10, and a portion of the light is transmitted to the wafer 20, thereby transferring the pattern of the mask image region to the wafer 20. In the depicted embodiment, the wafer 20 is exposed to extreme ultraviolet (EUV) radiation (light) using the mask 10. In an example, the EUV radiation has a wavelength of about 1 nm to about 100 nm. The mask image region can be transferred to the wafer 20 multiple times using multiple exposures with the mask 10. For example, in FIG. 1B, the mask 10 is used in multiple exposure processes to pattern the wafer 20, such that the pattern of the mask image region is transferred to various fields 22 of the wafer 20. Each field 22 corresponds to at least one semiconductor device (or at least one integrated circuit device) and represents an area of the wafer 20 that will be processed at a given time. For example, an exposure tool (such as a stepper or a scanner) processes one field (such as exposing a field 22 of the wafer 20 to the mask 10), then processes the next field (such as exposing another field 22 of the wafer 20 to the mask 10), and so on. In the present example, the wafer 20 includes a resist layer disposed over a substrate, where the pattern of the mask image region is transferred to the resist layer.

During the exposure process of each field 22, exposure light leaks to adjacent fields 22, particularly near edges and corners of the fields. Such light leakage can be attributed to positional accuracy of the mask 10 with respect to the wafer 20, positional accuracy of the mask 10 with respect to the exposure tool, light diffraction, and/or other phenomena. In the present example, light leakage may result from positional accuracy of the mask 10 with respect to the exposure tool, such as the stepper or the scanner. For example, for each exposure process, the exposure tool defines a portion of the mask 10 for exposing light thereon. An exposure slit of the exposure tool (defined by blades of the exposure tool, in an example) may define the portion of the mask 10 that will be exposed to the light. Ideally, the light exposes the mask image region of the mask 10. Typically, however, the exposure slit will expose an area of the mask 10 outside the mask image region. In the depicted embodiment, a portion of the mask border region of the mask 10 represents an area of the mask 10 that is outside the mask image region that will be exposed to the light (in other words, an area of the mask 10 outside the mask image region that is not covered by the exposure tool). Here, the portion of the mask border region of the mask 10 is adjacent to the mask image region. Because the portion of the mask border region of the mask 10 is exposed to light during the exposure process, the mask border region undesirably transmits a portion of light to the wafer 20, resulting in edges of the fields 22 receiving double exposure and corners of the fields receiving quadruple exposure. This is generally referred to as border effect.

Figure 2:
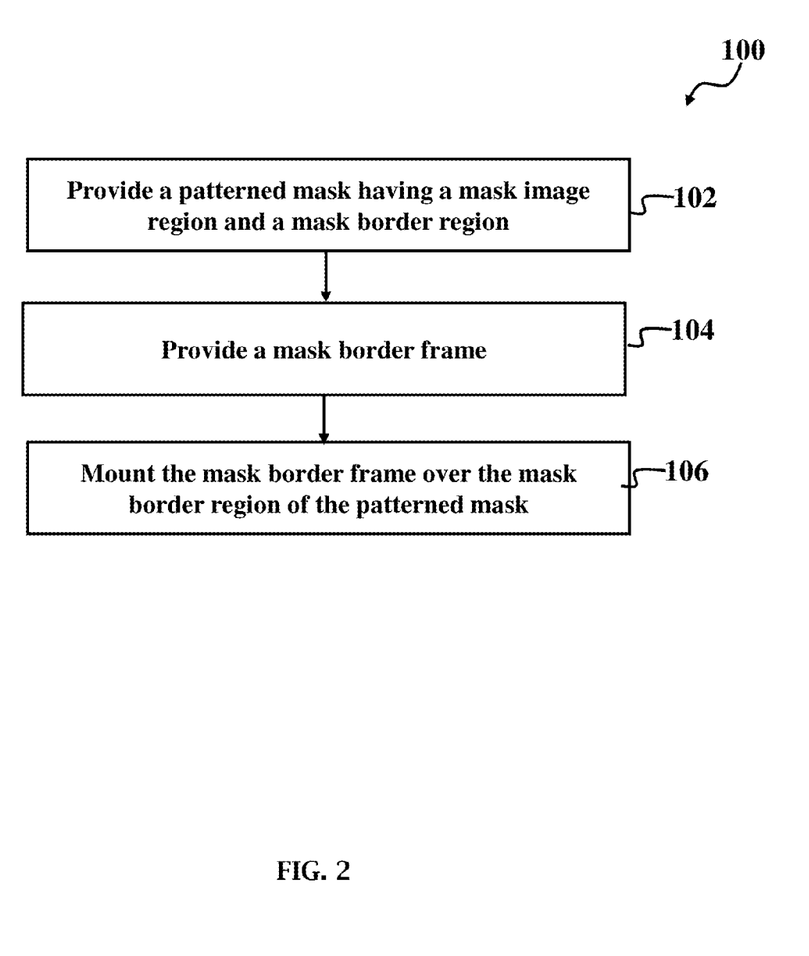
FIG. 2 is a flow chart of a method for fabricating a mask according to various aspects of the present disclosure.
Figure 3:
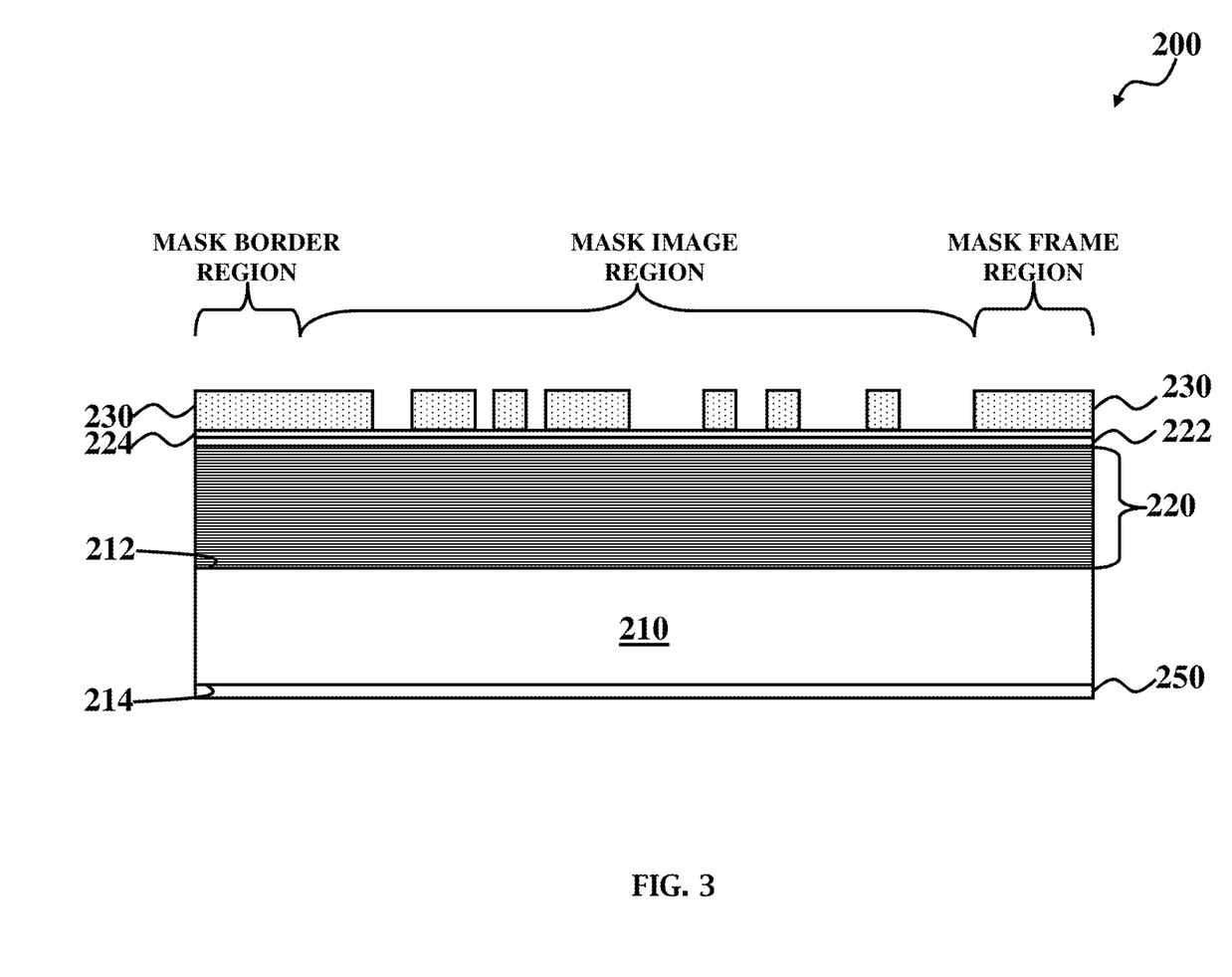
FIG. 3 is a diagrammatic cross-sectional side view of a mask according to various aspects of the present disclosure.
Figure 4A:
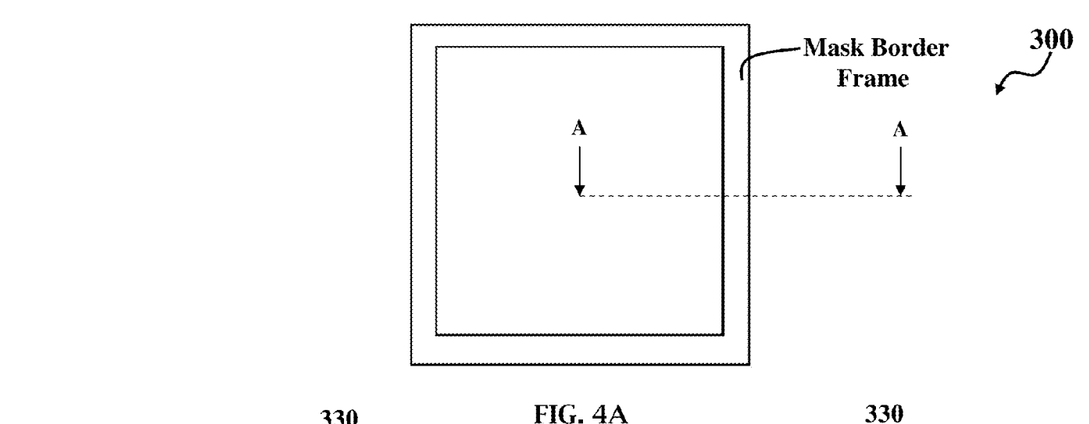
FIG. 4A is a top schematic view of a mask border frame, in portion or entirety, according to various aspects of the present disclosure.
Figure 4B:
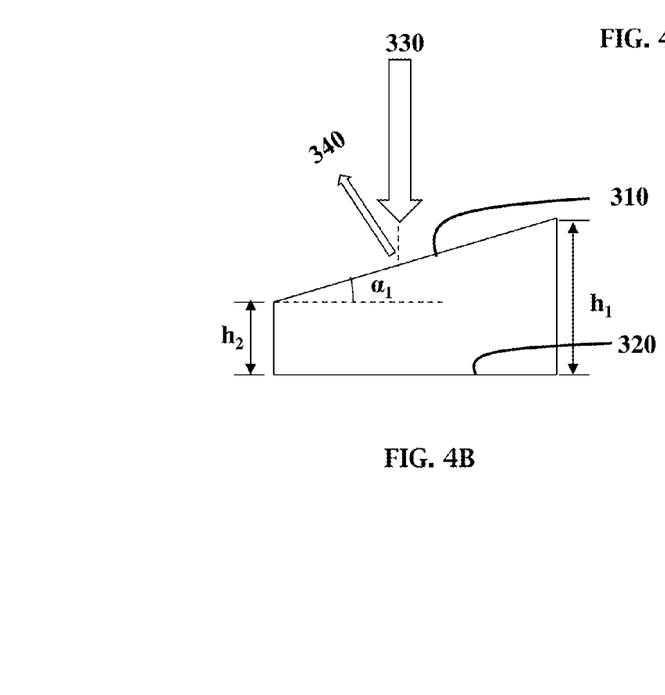
FIGS. 4B and 4C are diagrammatic cross-sectional side views of the mask border frame along line A-A in FIG. 4A.
Figure 4C:
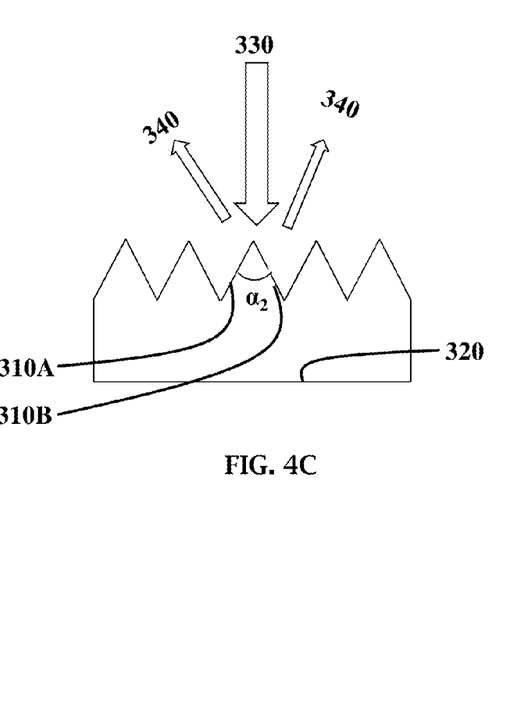
Figure 5:
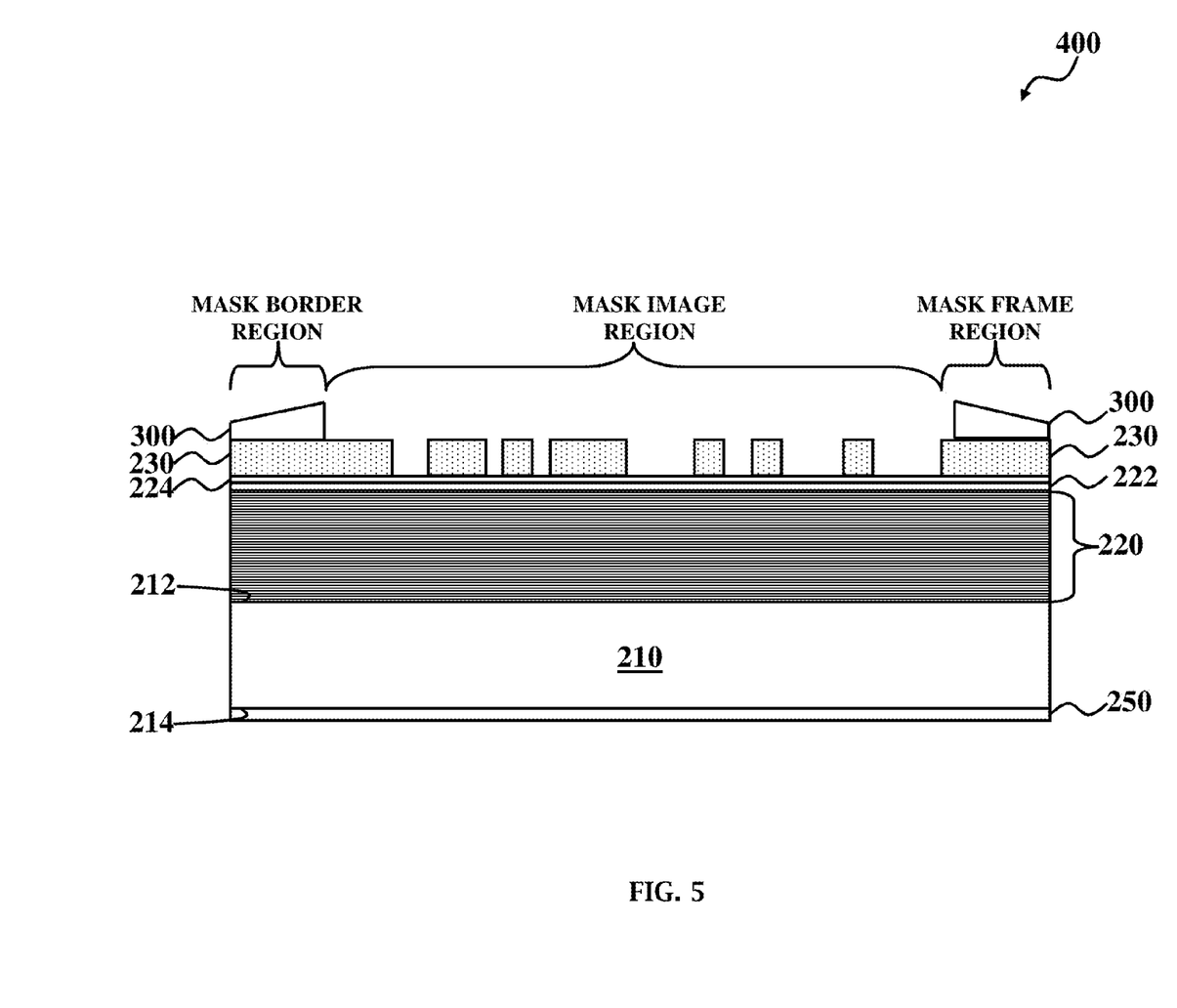
FIG. 5 is a diagrammatic cross-sectional side view of another mask according to various aspects of the present disclosure.

The present disclosure configures a mask border frame disposed at a mask border region of an EUV mask to mitigate border effect. FIG. 2 is a flowchart of a method 100 of fabricating an EUV mask according to aspects of the present disclosure. FIG. 3 is a cross-sectional view of one embodiment of a patterned mask 200 at various fabrication stages of the method 100. FIG. 4A is a top schematic view of a mask border frame 300, in portion or entirety, according to various aspects of the present disclosure. FIGS. 4B and 4C are cross-sectional views of the mask border frame 300 along A-A line in FIG. 4A. FIG. 5 is a cross-sectional view of one embodiment of a mask 400 at various fabrication stages of the method 100.

Referring to FIGS. 2 and 3, the method 100 begins at step 102 by providing a patterned mask 200. The patterned mask 200 is similar in many respects to those discussed above in association with FIG. 1A. The patterned mask 200 includes a mask image region and a mask border region. The mask image region is an area of the patterned mask 200 that includes a pattern (or design) of a layer of an integrated circuit device (or chip). For example, the patterned mask 200 includes a pattern (or design) of a layer of a resistor, a capacitor, an inductor, a diode, a metal-oxide-semiconductor field effect transistor (MOSFET), a complementary MOS (CMOS) transistor, a bipolar junction transistor (BJT), a laterally diffused MOS (LDMOS) transistor, a high power MOS transistor, a fin-like field effect transistor (FinFET), other integrated circuit component, or combination thereof. The mask image region may also include other components or structures outside of an integrated circuit device. For example, a mask image region can include two die, and the scribe area there-between. The mask border region is an area of the mask 200 that does not include the pattern (or design) of the layer of the integrated circuit device. The mask border region may include a pattern (or designs) that define alignment marks (also referred to as fiducial marks). The mask border region borders the mask image region and, in the present example, surrounds (or defines the area of) the mask image region.

The patterned mask 200 includes a substrate 210 that has a surface 212 and a surface 214 that is opposite the surface 212. The substrate 210 includes a low thermal expansion material (LTEM), such as quartz or glass. In an example, the LTEM substrate is a $SiO_2$—$TiO_2$-based glass substrate. A reflective multilayer coating 220 is disposed over the substrate 210, particularly over the surface 212 of the substrate 210. The reflective multilayer coating 220 (also referred to as a multilayer mirror (MLM)) includes a number of material layer/film pairs, where each pair includes at least two material layers having different refractive indices. A typical number of film pairs is about twenty to about eighty pairs, however, the reflective multilayer coating 220 may have any number of film pairs. The material of the at least two material layers is selected such that the reflective multilayer coating 220 exhibits high reflectivity to a particular radiation type/wavelength. In the depicted embodiment, the reflective multilayer coating 220 includes material layer pairs that exhibit high reflectivity to EUV radiation. For example, the reflective multilayer coating 220 includes molybdenum-silicon (Mo/Si) film pairs (in other words, each pair includes a molybdenum layer disposed above or below a silicon layer). In an example, the reflective multilayer coating 220 includes forty Mo/Si film pairs. Alternatively, the reflective multilayer coating 220 includes molybdenum-beryllium (Mo/Be) film pairs, or any other combination of material film pairs that exhibit high reflectivity at EUV wavelengths. A thickness of the reflective multilayer coating 220 may be adjusted to achieve maximum constructive interference of the EUV radiation reflected at each interface of the film pairs while achieving a minimum absorption of the EUV radiation by the reflective multilayer coating 220. A thickness of each layer of the reflective multilayer coating 220 is determined based on the type of EUV radiation and incident angle of the EUV radiation projected onto the patterned mask 200. In the depicted embodiment, each of the molybdenum layers and the silicon layers of the Mo/Si film pairs have a thickness of about 4 nm to about 7 nm.

The patterned mask 200 may also include a capping layer 222 disposed over the reflective multilayer coating 220. In one embodiment, the capping layer 222 includes a silicon-containing material, such as silicon. In an example, the capping layer 222 is a silicon layer of a topmost Mo/Si film pair of the reflective multilayer coating 220. The capping layer 222 can prevent oxidation of the reflective multilayer coating 220, for example, during processing of the patterned mask 200. The capping layer 222 may thus include a material, other than a silicon-containing material, that prevents oxidation of the reflective multilayer coating 220. In an example, the capping layer 222 has a thickness of about 4 nm to about 7 nm.

The patterned mask 200 may also include a buffer layer 224 disposed over the capping layer 222. The buffer layer 224 includes a material that protects the reflective multilayer coating 220 during processing of the patterned mask 200 (for example, during etching of an absorption layer of the patterned mask 200). In the depicted embodiment, the buffer layer 224 includes a ruthenium-containing material, such as Ru, RuNb, RuZr, RuMo, RuY, RuB, RuTi, RuLa, other ruthenium-containing material, or combinations thereof. Alternatively, the buffer layer 224 includes a chromium-containing material, such as Cr, CrN, CrO, CrC, CrON, CrCN, CrOC, CrOCN, other chromium-containing material, or combinations thereof. In yet another alternative, the buffer layer 224 includes materials other than ruthenium-containing materials and chromium-containing materials. The buffer layer 224 may include a combination of ruthenium-containing material, chromium-containing material, and other material, for example, where the buffer layer 224 includes multiple layers. In an example, the buffer layer 224 has a thickness of about 2 nm to about 5 nm. It is noted that, in alternative embodiments, the capping layer 222 and buffer layer 224 may be a single layer.

The patterned mask 200 includes an absorption layer 230 disposed over the buffer layer 224. The absorption layer 230 may have a multiple layers. The absorption layer 230 includes various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the patterned mask 200. For example, etching characteristics of the one or more layers of the absorption layer 230 provide process flexibility, which can reduce manufacturing time and costs.

The absorption layer 230 is patterned to define the mask image region and the mask border region. A pattern (or design) of the layer of the integrated circuit device (or chip) is defined in the mask image region of the patterned mask 200. The absorption layer 230 may also define the pattern of alignment marks in the mask border region of the patterned mask 200. The absorption layer 230 may be patterned by lithography and etch processes. The etch process may include wet etch, dry etch, or a combination thereof.

A conductive layer 250 is disposed over the substrate 210, particularly over the surface 214 of the substrate 210. The conductive layer includes a material that facilitates electrostatic chucking. For example, the conductive layer 250 includes a chromium-containing material, such as Cr, CrN, CrO, CrC, CrON, CrCN, CrOC, CrOCN, other chromium-containing materials, or combinations thereof. In the depicted embodiment, the conductive layer 250 is a CrN layer. In an example, the conductive layer 250 has a thickness of about 10 nm to about 30 nm.

The reflective multilayer coating 220, capping layer 222, buffer layer 224, absorption layer 230, and conductive layer 250 are formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD (APCVD), low pressure CVD (LPCVD), plasma enhanced CVD (PECVD), or high density plasma CVD (HDPCVD)), ion beam deposition, spin-on coating, metal-organic decomposition (MOD), other suitable methods, or combinations thereof. It is noted that the conductive layer 250 may be formed before or after patterning of the absorption layer 230.

Referring to FIGS. 2, 4A, 4B, and 4C, the method 100 proceeds to step 104 by providing a mask border frame 300. The mask border frame 300 includes materials with adequate mechanical and chemical properties, such as silicon. The mask border frame 300 has a first surface 310 and a second surface 320. The first surface 310 is not substantially parallel to the second surface 320. This non-parallel-surface structure is designed to reflect an incident light 330 in a different direction, as compared to a reflection light 340, so that the incident light will go out of the pupil plane of an illuminator to mitigate the border effect. In one embodiment, as shown in FIG. 4B, the first surface 310 is tilted with a first angle $\alpha_1$ to the second surface 320, hereinafter referred to as a tilted mask border frame 300. The first angle $\alpha_1$ is larger than the incident chief ray angle of EUV light on the mask, typically in a range from 10 degree to 30 degree. The tilted mask border frame 300 has a first height $h_1$ and a second height $h_2$. The first height $h_1$ is larger than the second height $h_2$. In another embodiment, the first surface 310 is formed with multiple of facets while the second surface 320 is a flat surface. As an example, the first surface 310 is includes two facets, 310A and 310B, in a repeatable manner, hereinafter referred to as a two-facet mask border frame 300. The facets 310A and 310B have a second angle $\alpha_2$ to each other. The second angle $\alpha_2$ is any non-zero angle, and typically in a range from 30 to 150 degree.

Referring to FIGS. 2 and 5, the method 100 proceeds to step 106 by mounting the mask border frame 300 to the mask border region of the patterned mask 200 to form the EUV mask 400. A method of mounting the mask border frame 300 includes interposing a pressure-sensitive adhesive agent between the mask border frame 300 and the patterned mask 200 and then applying an adequate pressure to adhere the mask border frame 300 to the patterned mask 200. In one embodiment, a process of mounting the mask border frame 300 is compatible to pellicle mounting. The mask border frame 300 is mounted directly onto the mask border region of the patterned mask 200 by using surface-mount or other technology processes.

In one embodiment, the tilted mask border frame 300 is mounted over the mask border region of the patterned mask 200 such that a side having the first height $h_1$ is located adjacent to the mask image region while a side having the second height $h_2$ is located away from the mask image region. In another embodiment, the two-facet mask border frame 300 is mounted over the mask border region of the patterned mask 200 such that the second surface 320 adheres to the mask border region.

During an exposure process, light (radiation) is projected onto the EUV mask 400. A portion of the light is transmitted to a wafer, thereby transferring the pattern of the mask image region to the wafer. Another portion of the light is reflected away by the mask border frame 300 to mitigate the border effect. The mask image region can be transferred to the wafer multiple times using multiple exposures with the EUV mask 400. For example, the EUV mask 400 can be used in multiple exposure processes to pattern the wafer, such that the pattern of the mask image region is transferred to various fields of the wafer, as described with reference to mask 10 and FIGS. 1A and 1B above. Each field corresponds to at least one device or die (or at least one integrated circuit device) and represents an area of the wafer that will be processed at a given time. For example, an exposure tool (such as a stepper or a scanner) processes one field (such as exposing a field of the wafer to the EUV mask 400), then processes the next field (such as exposing another field of the wafer to the EUV mask 400), and so on. As described above, with the mask border frame 300, the EUV mask 400 reduces reflectivity of the mask border region, thereby reducing the amount of exposure experienced in adjacent fields (such as that illustrated in FIGS. 1A and 1B), particularly at edges of adjacent fields and corners of adjacent fields. Such reduction in light leakage enhances a resulting aerial image contrast realized by the EUV mask 400 during integrated circuit device fabrication.

The present disclosure provides for many different embodiments. An exemplary mask includes a substrate, a reflective multilayer coating disposed over the substrate, a patterned absorption layer disposed over the reflective multilayer. The patterned absorption layer has a mask image region and a mask border region. The exemplary mask also includes a mask border frame disposed over the mask border region. The mask border frame has a top surface and a bottom surface. The top surface is not parallel to the bottom surface.

An exemplary method includes providing a patterned mask having a mask image region and a mask border region, providing a mask border frame having a first surface and a second surface. The first surface is substantially not parallel to the second surface. The method also includes mounting the second surface of the mask border frame to the mask border region of the patterned mask.

An exemplary lithography process includes providing an extreme ultraviolet (EUV) mask having a mask image region and a mask border region. The mask image region of the EUV mask includes a pattern of an integrated circuit device and the mask border region includes a mask border frame. The process also includes exposing a wafer to EUV radiation using the EUV mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   a substrate;
   a reflective multilayer coating disposed over the substrate;
   a patterned absorption layer disposed over the reflective multilayer, wherein the patterned absorption layer has a mask image region and a mask border region; and
   a mask border frame disposed over the mask border region, wherein the mask border frame has a top surface and a bottom surface, wherein the top surface is not parallel to the bottom surface.

2. The mask of claim 1, wherein the top surface of the mask border frame is tilted an angle to the bottom surface.

3. The mask of claim 2, wherein the angle is in a range from about 10 degree to about 30 degree.

4. The mask of claim 3, wherein the tilt mask border frame is thicker adjacent the mask image region of the patterned mask.

5. The mask of claim 1, wherein the top surface of the mask border frame is formed by multiple facets.

6. The mask of claim 5, wherein the top surface of the mask border frame is formed by a first facet and a second facet in a repeatable manner.

7. The mask of claim 6, wherein an angle between the first facet and second facet, is in a range from 30 to 150 degrees.

8. The mask of claim 1, further comprising:
   a buffer layer disposed between the reflective multilayer coating and the patterned absorption layer; and
   a capping layer disposed between the reflective multilayer coating and the buffer layer.

9. The mask of claim 1, further comprising a conductive layer disposed over the substrate, wherein the reflective multilayer coating is disposed over a first surface of the substrate and the conductive layer is disposed over a second surface of the substrate, the second surface being opposite the first surface.

10. The mask of claim 1, wherein the mask border frame includes silicon.

11. A mask comprising:
    a substrate having two regions, a mask border region and a mask image region;
    the mask image region including:
      a first reflective structure disposed over the substrate; and
      an absorption layer disposed over the first reflective structure layer; and
    the mask border region including:
      the first reflective structure disposed over the substrate,
      the absorption layer disposed over the first reflective structure, and
      a second reflective structure disposed over the absorption layer, the second reflective structure including a top surface tapering away from the mask image region.

12. The mask of claim 11, wherein the top surface of the second reflective structure is multi-faceted such that a first facet tapers away from the mask image region and a second facet tapers towards the mask image region.

13. The mask of claim 11, wherein the first reflective structure includes a reflective multilayer coating disposed over the substrate.

14. The mask of claim 13 being an extreme ultraviolet (EUV) phase shift mask.

15. A method comprising:
    providing a patterned mask having a mask image region and a mask border region, wherein the mask image region includes a reflective multilayer structure disposed over a substrate and a patterned absorption layer disposed over the reflective multilayer structure, and wherein the mask border region includes the reflective multilayer structure disposed over the substrate and the patterned absorption layer disposed over the reflective multilayer structure;
    providing a mask border frame having a first surface and a second surface, wherein the first surface is not parallel to the second surface; and
    mounting the second surface of the mask border frame to the mask border region of the patterned mask.

16. The method of claim 15, wherein the first surface of the mask border frame is tilted to the second surface.

17. The method of claim 16, wherein the mask border frame is mounted over the mask image region such that the mask border frame has a first thickness adjacent the mask image region and a second thickness adjacent an outer boundary of the mask image region, the first thickness being greater than the second thickness.

18. The method of claim 15, wherein the first surface of the mask border frame is formed to have a first facet and a second facet, in a repeatable manner, while the second surface is a flat surface.

19. The method of claim 18, wherein the flat second surface of the mask border frame is mounted over the mask image region of the patterned mask.

20. The method of claim 11, wherein the mask border frame is mounted over the mask image region by interposing a pressure-sensitive adhesive agent between the mask border frame and the patterned mask and then applying an adequate pressure to adhere the mask border frame to the patterned mask.

* * * * *